(12) United States Patent
Della Mina et al.

(10) Patent No.: US 9,019,765 B2
(45) Date of Patent: Apr. 28, 2015

(54) SEMICONDUCTOR DEVICE, DATA PROGRAMMING DEVICE, AND METHOD FOR IMPROVING THE RECOVERY OF BIT LINES OF UNSELECTED MEMORY CELLS FOR PROGRAMMING OPERATION

(71) Applicant: PS4 Luxco S.a.r.l., Luxembourg (LU)

(72) Inventors: Diego Della Mina, Colle Brianza (IT); Osama Khouri, Bellano (IT); Chiara Missiroli, Concorezzo (IT)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/918,590

(22) Filed: Jun. 14, 2013

(65) Prior Publication Data
US 2014/0369125 A1     Dec. 18, 2014

(51) Int. Cl.
G11C 11/34    (2006.01)
G11C 5/14     (2006.01)
G11C 16/24    (2006.01)
G11C 16/10    (2006.01)

(52) U.S. Cl.
CPC ............... G11C 16/24 (2013.01); G11C 16/10 (2013.01)

(58) Field of Classification Search
CPC ........ G11C 16/10; G11C 16/12; G11C 16/24; G11C 16/30
USPC ............... 365/11, 12, 17, 18, 185.12, 185.17, 365/185.18, 185.25, 185.33, 226
See application file for complete search history.

(56) References Cited

U.S. PATENT DOCUMENTS

| | | | |
|---|---|---|---|
| 2003/0103400 A1* | 6/2003 | Van Tran | 365/207 |
| 2006/0092724 A1* | 5/2006 | Kanda | 365/200 |
| 2006/0203565 A1* | 9/2006 | Lee et al. | 365/185.29 |
| 2007/0002621 A1* | 1/2007 | Park | 365/185.11 |
| 2007/0086251 A1* | 4/2007 | Lutze et al. | 365/195 |
| 2007/0297228 A1* | 12/2007 | Song et al. | 365/185.08 |
| 2008/0049511 A1* | 2/2008 | Crippa et al. | 365/185.19 |
| 2008/0186766 A1* | 8/2008 | Ogura et al. | 365/185.05 |
| 2008/0291743 A1 | 11/2008 | Edahiro | |
| 2009/0067236 A1* | 3/2009 | Isobe et al. | 365/185.03 |
| 2009/0097325 A1* | 4/2009 | Won et al. | 365/185.22 |
| 2010/0214837 A1* | 8/2010 | Sako et al. | 365/185.03 |
| 2011/0058423 A1* | 3/2011 | Fujimura | 365/185.17 |
| 2011/0058424 A1* | 3/2011 | Goda et al. | 365/185.19 |
| 2011/0249503 A1* | 10/2011 | Yamada et al. | 365/185.19 |
| 2011/0292737 A1* | 12/2011 | Choi | 365/185.25 |
| 2012/0170379 A1* | 7/2012 | Ahn | 365/185.25 |
| 2013/0258780 A1* | 10/2013 | Khouri et al. | 365/185.17 |

OTHER PUBLICATIONS

Palumbo et al., "Charge Pump Circuits: An Overview on Design Strategies and Topologies", IEEE Circuit and Systems Magazine, First Quarter 2010, pp. 31-45.*

* cited by examiner

Primary Examiner — Trong Phan

(57) ABSTRACT

A device comprises a non-volatile memory array, a first selection circuit selecting whether to make a first connection path between a first bit line and a first circuit node, and selecting whether to make a second connection path between the first bit line and a second circuit node, a power supplying circuit supplying a power supply voltage to the first circuit node, the power supply voltage being, when the first connection path is selected to be made, supplied to the first bit line, and a first voltage supplying circuit supplying a first voltage to the second circuit node, the first voltage being, when the second connection path is selected to be made, supplied to the first bit line, the first voltage and the power supply voltage being higher than a ground potential, and the first voltage being higher than the power supply voltage.

18 Claims, 8 Drawing Sheets

SEMICONDUCTOR DEVICE, DATA PROGRAMMING DEVICE, AND METHOD FOR IMPROVING THE RECOVERY OF BIT LINES OF UNSELECTED MEMORY CELLS FOR PROGRAMMING OPERATION

FIELD OF THE DISCLOSURE

The present disclosure relates to a semiconductor device, and particularly, but not exclusively, relates to a non-volatile semiconductor memory device including a memory array for improving the recovery time of bit lines of unselected cells during a programming operation, and method regarding the same, and the following description is made with reference to this field of application for convenience of explanation only.

BACKGROUND OF THE DISCLOSURE

A semiconductor memory device, represented by a NAND memory device, includes a plurality of memory cells, and one or more of these cells may be programmed during a programming operation of the memory device. The programming of a cell is equivalent to writing a bit onto a cell.

A cell is a transistor or any equivalent thereof used in a memory array that is located at an intersection of a word line and a bit line. A memory array includes a plurality of cells arranged in an orderly manner along the x- and y-axes, and a cell is located at the intersection of a particular x- and y-axes, and generally, x-axis in a memory array is a word line, and y-axis is a bit line. A cell may be selected by selecting its corresponding bit line and word line.

A target cell to be programmed can be selected by first selecting its corresponding bit line and then programming via its corresponding word line. Selection of bit lines may be done by applying a voltage such that the selected bit lines carry a voltage different from the voltage that the unselected bit lines carry.

Recently, to satisfy the demands for a smaller and smaller size of the devices, a charge-trap technology has been introduced. A memory device that is manufactured using the charge-trap technology is a charge-trap NAND memory device (CT-NAND memory), and is widely used because it allows much smaller process geometries.

However, due to the smaller size of the CT-NAND memories, these devices are more susceptible to electronic and magnetic couplings between the neighboring cells, in particular, between the neighboring bit lines of selected cells at a first voltage and the bit lines of unselected cells at a second voltage. As the second voltage is usually higher than the first voltage, such a coupling effect may cause an undesired voltage drop in the bit lines of unselected cells.

In this view, it is required to compensate for such a voltage drop during the programming operation, especially for bit lines of unselected cells.

SUMMARY

According to an embodiment of the present disclosure, there may be provided a device including a non-volatile memory array that includes first and second selection transistors, a plurality of memory cells coupled between the first and second selection transistors, a first bit line coupled to the first selection transistor, and a first source line coupled to the second selection transistor, first and second circuit nodes, a first selection circuit selecting whether to make a first connection path between the first bit line and the first circuit node, and selecting whether to make a second connection path between the first bit line and a second circuit node, a power supplying circuit coupled to the first circuit node and supplying a power supply voltage to the first circuit node, the power supply voltage being, when the first connection path is selected to be made by the first selection circuit, supplied to the first bit line, and a first voltage supplying circuit coupled to the second node and supplying a first voltage to the second circuit node, the first voltage being, when the second connection path is selected to be made by the first selection circuit, supplied to the first bit line, the first voltage and the power supply voltage being higher than a ground potential, and the first voltage being higher than the power supply voltage.

According to another embodiment of the present disclosure, there may be provided a method including performing a program operation on a non-volatile memory array that comprises first and second selection lines, a plurality of word lines, a plurality of bit lines, a plurality of NAND memory strings each including a first selection transistor coupled to an associated one of the bit lines and including a gate coupled to the first selection line, a second selection transistor including a gate coupled to the second selection line, and a plurality of memory cells coupled between the first and second selection transistors and each including a gate coupled to an associated one of the word lines. Performing the program operation includes selecting one or ones of the bit lines as a selection bit line, selecting a remaining of the bit lines as a non-selection bit line; generating from a power supply voltage a first voltage that is higher than the power supply voltage, the first voltage and the power supply voltage being higher than a ground voltage potential, supplying the ground voltage potential to the selection bit line so that memory cells associated with the selection bit line is allowed to be shifted to a program condition, and supplying the first voltage to the non-selection bit line so that memory cells associated with the non-selection bit line are prevented from being shifted to a program condition.

DETAILED DESCRIPTION OF THE EMBODIMENTS

One of representative examples of a technological concept of the present disclosure which seeks to solve, at least, the problems mentioned below while achieving the advantages mentioned above will be described. The claimed contents of the present application are not limited to the technological concept described below but are also described in the claims of the present application.

Figure 1:
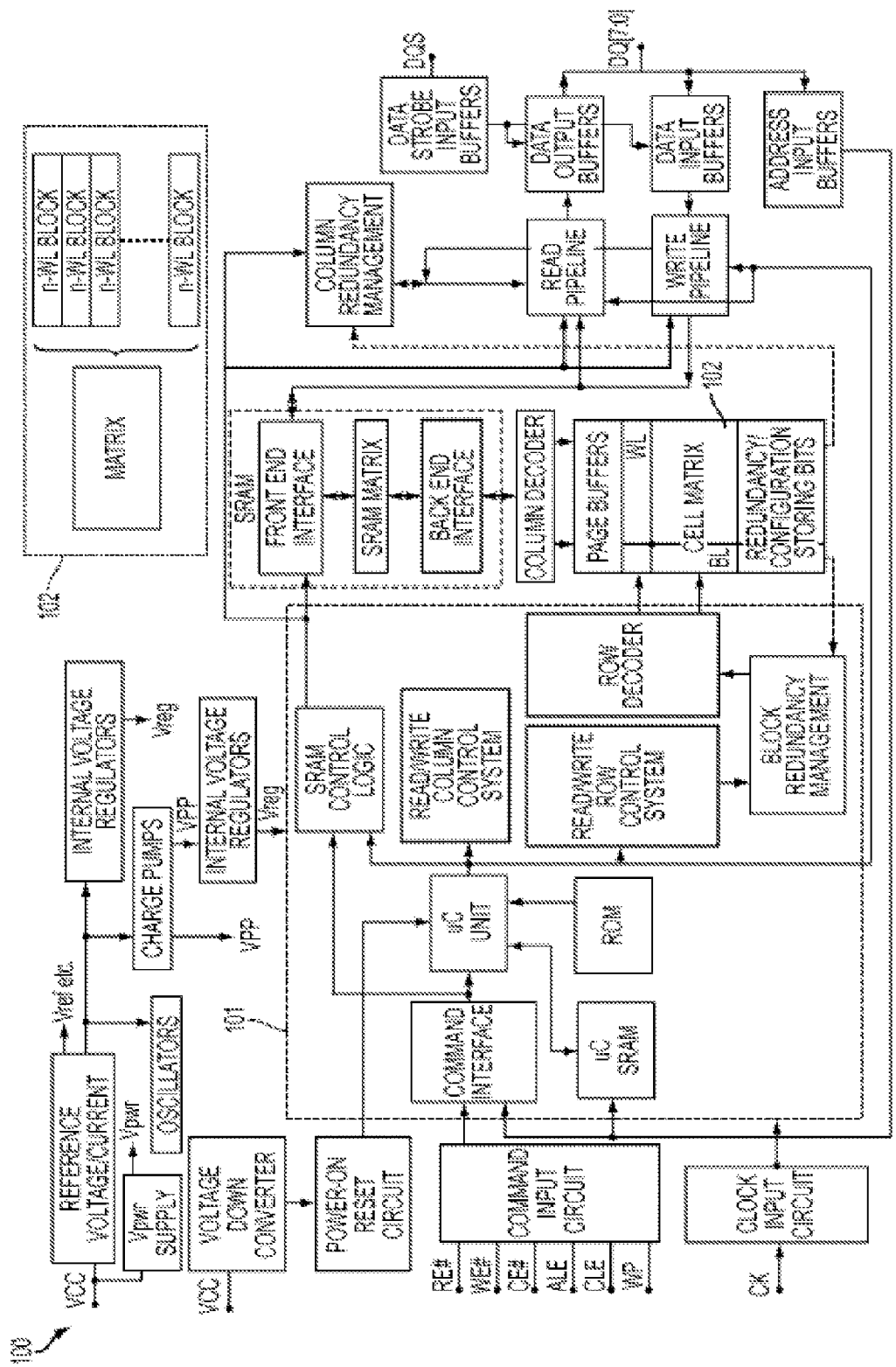
FIG. 1 schematically illustrates a block diagram of a semiconductor device, particularly a non-volatile CT-NAND memory device, to which embodiments of the present disclosure may apply.

The present disclosure makes reference to a NAND memory device, usually including one or more memory arrays, together with the dedicated circuitries, an example of which is shown in FIG. 1.

According to the embodiment explained below, there is provided a semiconductor device including a plurality of memory cells, and method regarding the same, in which the bit lines of unselected cells in a programming operation may be pre-charged to a programming-inhibit voltage and/or restored to the programming-inhibit voltage, in an efficient manner both in terms of the recovery time and power/current consumption, despite the coupling effect.

FIG. 1 schematically illustrates a block diagram of a semiconductor device, particularly a non-volatile CT-NAND memory device, to which embodiments of the present disclosure may apply.

The semiconductor device 100 includes a controller 101 and a non-volatile memory 102. The non-volatile memory may include a flash memory, a floating gate type NAND flash memory, and a charge trap type NAND flash memory. A cell of the charge trap type NAND memory may include a layer that traps and releases a charge according to program and erase, for example a silicon nitride layer.

The device 100 may also include a volatile memory (e.g., a static random-access memory, SRAM), as shown in the figure.

The device 100 includes a voltage down converter which is connected to a power supply (VCC), and a power-on reset circuit. The device also includes a command input circuit which is coupled to synchronization pads for receiving a read enable signal (RE#), a write enable signal (WE#), and a chip enable signal (CE#), and is connected to control pads for receiving an address latch enable signal (ALE) and a command latch enable signal (CLE), and is connected to a pad for receiving a write protect signal (WP). The device also includes a command interface which is included in the controller 101 and is connected to the command input circuit.

The command interface and the power-on reset circuit are connected to a microcontroller unit (uC UNIT), and a microcontroller RAM (e.g., uC SRAM) and ROM are accessible by the microcontroller unit uC UNIT. The device includes SRAM control logic which receives an output of the command interface and the microcontroller unit, and also includes read/write column control system and read/write row control system which receives an output of the microcontroller unit. The device also includes row decoder, column decoder and page buffers which are connected to the matrix (e.g., memory array). The memory array includes redundancy/configuration storing bits and a plurality of memory blocks (e.g., n-WL blocks). The matrix is also connected to block redundancy management and column redundancy management.

The device 100 includes a clock input circuit (CLOCK INPUT CIRCUIT) which receives a clock signal CK provided from external and output an internal clock to internal of the device 100. The internal clock signal may be used for the controller 101. The internal clock signal may be also used for a charge pump circuit. The internal clock may include a plurality of internal clock signals.

The device 100 includes a read pipeline which is connected to the column redundancy management and the front end interface of the SRAM, and receives an output of the SRAM control logic, and an output of the microcontroller unit. The device also includes a write pipeline which is connected to the front end interface of the SRAM and receives an output of the SRAM control logic and an output of the microcontroller unit. In the device 100, the read/write column control system accesses the back-end interface to control the SRAM matrix. The device 100 also includes data output buffers which receive data which is output of the read pipeline and data input buffers which inputs data to the write pipeline. The device also includes data strobe input buffers which are connected to a data strobe terminal (DQS) and which are connected to the data output buffers and the data input buffers, and address input buffers which input an address to the command interface and the microcontroller SRAM. The data output buffers, data input buffers, data strobe input buffers and address input buffers are connected to data pads (DQ[7:0]) for inputting data to the device and outputting data from the device.

The device 100 also includes a reference voltage/current generator, oscillators, charge pumps, internal voltage regulators which receive an output of the reference voltage/current generator, and another voltage regulator which receive an output of the charge pumps.

The various signals (e.g., VCC, RE#, WE#, CE#, ALE, CLE, WP and DQ) may be generated by a controller in a system or a digital processing apparatus for example a memory card, cellular phone. For example, the device may be connectable (e.g., fixedly connectable, removably connectable, wirelessly connectable, etc.) to such the digital processing apparatus via the pads for receiving VCC, RE#, WE#, CE#, ALE, CLE, WP and DQ which are illustrated in Figure.

Next, the non-volatile memory 102 may be coupled to a page buffer on one side and to a page storing redundancy/configuration bits to be used, for example, in set-up operations. The memory matrix 102 includes one or more word lines WL and one or more bit lines BL crossing the bit lines. A cell is where a bit line and a word line intersect with each other. As shown in the blown-up figure of the memory matrix 102, it includes a plurality of blocks, each comprising "n" number of word lines.

Next, the device 100 may operate under several different voltages—e.g., Vpwr, Vpp, Vref, and/or Vreg, as shown in the upper left corner of FIG. 1. An example of the voltage generator is shown herein where a "Reference Voltage/Current Circuit" and "Vpwr Supply Circuit" are each connected to the input voltage, VCC. The output of the "Vpwr Supply Circuit" is Vpwr, the power supply voltage suited for internal use, and the output of the "Reference Voltage/Current Circuit" is Vref etc., the reference voltage or current also suited for internal use. This reference voltage may be inputted to a "Charge Pump" to generate Vpp, which is a voltage that is pumped up from Vref. Vpp may be inputted to an "Internal Voltage Regulator" to generate a regulated voltage, Vreg, or the reference voltage (Vref) may be inputted to the Internal Voltage Regulator to generate a different regulated voltage, Vreg. One or more of these voltage may be used in one or more of different internal components of the semiconductor device 100, including but not limited to the memory matrix 102, but for convenience of explanation only, the use in the matrix 102 will be primarily described herein, and other uses in different components of the semiconductor device 100 would be apparent to one of ordinary skill in the art. Further, the description of structural configuration and/or functional operation of the rest of the labelled components in the semiconductor device 100 will be omitted herein for the convenience of explanation as such will be apparent to one of ordinary skill in the art.

Figure 2:
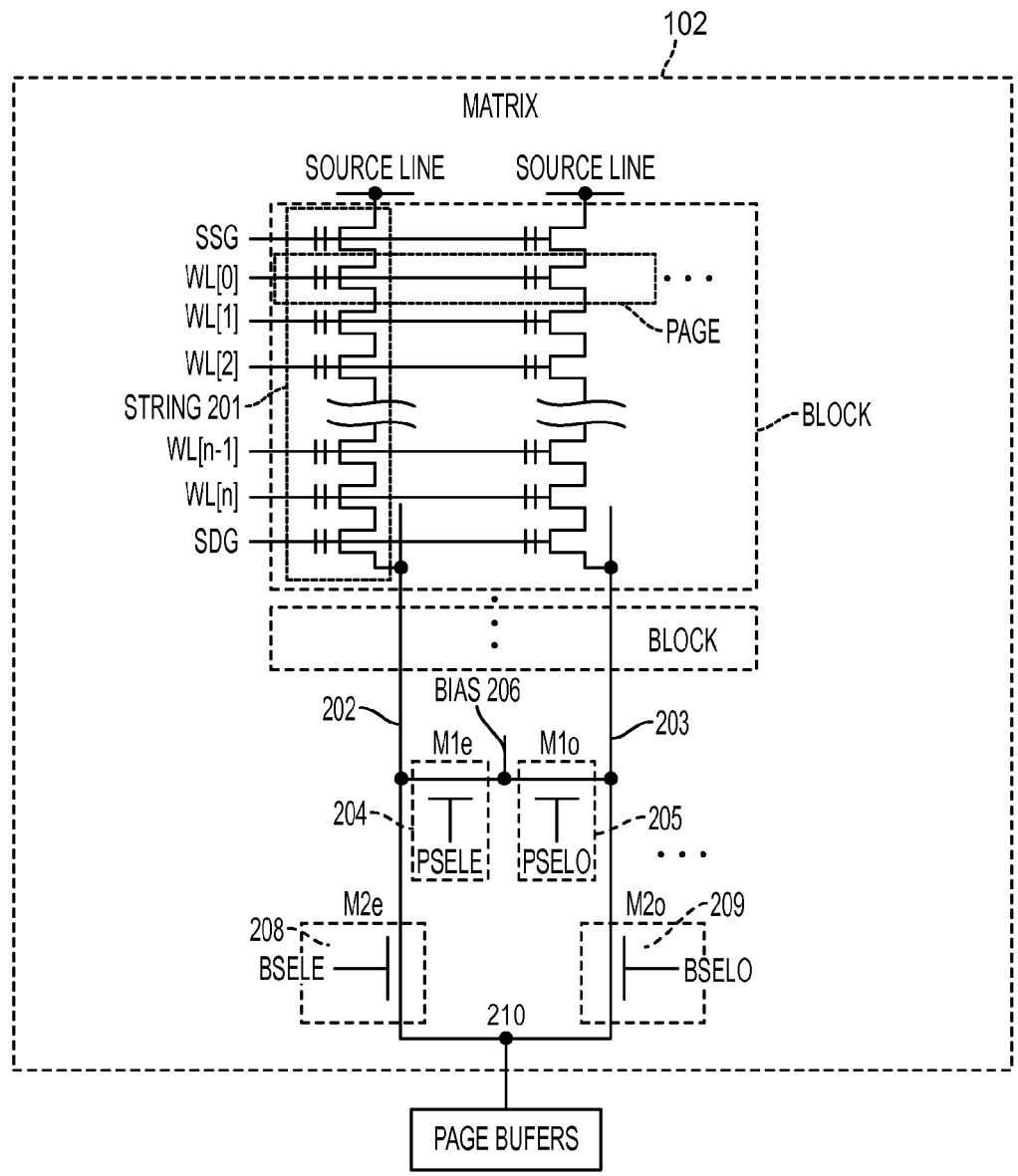
FIG. 2 schematically shows a detailed view of the memory matrix in FIG. 1, according to a first embodiment of the present disclosure.

FIG. 2 schematically shows a detailed view of the memory matrix 102 in FIG. 1, according to a first embodiment of the present disclosure.

The matrix 102 includes a plurality of memory blocks. Each of the memory blocks may include a plurality of memory strings 201 each including a plurality of NAND memory cells and their select transistors.

The matrix 102 also includes a pre-charge selector 204 (e.g., transistor M1e) and 205 (e.g., transistor M1o), and page-buffer selectors 208 (e.g., transistor M2e) and 209 (e.g., transistor M2o).

The page buffers include a plurality of flip flops each coupled to an associated one of bit lines. In FIG. 2, a pair of odd and even bit lines is exemplified.

More specifically, in one block of the matrix 102, "n" number of transistors are connected in series between a source selector transistor SSG and a drain selector transistor SDG to form what is called a memory string 201. The source selector transistor SSG is connected to a source line, and the drain selector transistor SDG is connected to a bit line 202. There is another memory string of transistors that pairs with the string 201, such that the string 201 may represent an even (or odd) string and the pairing string may represent an odd (or even) string, or vice versa. The pair string to string 201 also has a similar configuration as the string 201—it is also connected between a source selector transistor SSG and a drain selector transistor SDG, where SSG is connected to a source line, and SDG is connected to a bit line 203 that is different from the bit line 202.

A pair of transistors on a same word line (e.g., WL[0]), whose gate electrodes are connected to the same word line, forms a page of a memory cell, as shown in the figure.

Bit line 202 is coupled to a page-buffer selector 208, and bit line 203 is coupled to a page-buffer selector 209, and both the page-buffer selectors 208 and 209 are connected to the page buffer(s) that contain the programming data through node 210.

The data stored in the page buffer(s) include information regarding which cells are to be programmed (e.g., selected cells) or which cells are to be not programmed (e.g., unselected cells). For example, in accordance with the programming data stored in the page buffers, a bit line may be a bit line of an unselected cell or a bit line of a selected cell. The page-buffer circuit may store not only the data to be programmed or written into the memory cells, but also the data to be read out from the memory cells.

The data stored in the page buffers (e.g., data to be programmed or read out from the memory cells) may be conveyed to the bit lines of corresponding target memory cells via the page-buffer selectors 208 and 209—for example, when the page-buffer selector 208 is activated, the data from the page-buffer may be conveyed onto the bit line 202, and when the page-buffer selector 209 is activated, the data from the page-buffer may be conveyed onto the bit line 203.

Bit line 202 is coupled to a corresponding pre-charge selector 204, and bit line 203 is coupled to a corresponding pre-charge selector 205. The pre-charge selector 204 is then connected in series with the pre-charge selector 205, and the connecting node is coupled to BIAS node 206.

BIAS node 206 is supplied with a voltage that may be passed on to the corresponding bit line via selectors 204 and/or 205. If bit line 202 is an even bit line, then bit line 203 is an odd bit line, or vice versa.

[Programming Operation]

A programming operation of a non-volatile memory, especially CT-NAND memory, according to the first embodiment, is performed on a page of the memory array, in which a cell to be programmed is biased by having a high voltage on the gate (word line) and a ground voltage on the channel, which will cause a Fowler-Nordheim effect to program the cell.

For example, the programming is done in the following manner:

(i) performing a pre-charge operation on bit lines (202 and/or 203)

(ii) and then applying a program voltage (for example 20 volt) to the corresponding word line, WL[0] where WL[0] is a selected word line. Also, (ii) applying another voltage (for example 10 volt) to the corresponding word lines, WL[1] to WL [n] where WL[1] to WL [n] is an unselected word line. The cells (page) to be programmed are addressed by address information that is supplied from a address terminal. The page buffer holds data to be programmed that is supplied from a data terminal. The page buffer is determined whether to be connected to corresponding bit line by corresponding drain selector, and according to the data held temporarily by the page buffer, bias voltages (i.e. ground or inhibit voltage) is produced on the corresponding bit line as explained above and below.

At above (i), after the pre-charge operation (a) has been performed, for example, the bit line of a selected cell is brought to a first voltage value (e.g., ground voltage), and the bit line of an unselected cell is brought to a second voltage (e.g., a control voltage). The second voltage is larger than the first voltage (e.g., ground voltage).

Under such bit line voltage condition, at the above (ii), a voltage is applied to the word lines.

In this view, the ground voltage of a selected bit line is produced in order to program the selected cell. The control voltage (inhibit voltage) of the unselected bit line is produced in order to prevent the unselected cell from being programmed.

Here, for a floating-gate memory device, a second voltage (e.g., control voltage) to be applied to the bit line(s) of an unselected cell(s) is simply power supply voltage (e.g., Vpwr in FIG. 1), not a voltage that is greater (larger) than the power supply voltage.

However, for a CT-NAND memory device, such the simply power supply voltage is not high enough, especially in consideration of occurrence of a voltage drop due to the coupling effect as mentioned above.

In this view, in the embodiment of the present invention, a second voltage (e.g., a control voltage) to be applied to the bit line(s) of an unselected cell(s) is greater (larger) than a power supply voltage (e.g., the control voltage is Vpp or Vreg higher than Vpwr, as shown in FIG. 1).

More preferably, the greater control voltage than the power supply voltage is applied to a charge trap type memory devices (a charge trap type of a flash memory cell).

Accordingly, for a CT-NAND memory device, a charge pump, voltage regulator or equivalent thereof for generating a derivative voltage from Vpwr can be used. BIAS 206 shown in FIG. 2 is a node to which such the derivative voltage is supplied.

[Bit-Line Pre-Charge During Program Operation]

The purpose of a bit-line pre-charge of a non-volatile memory, especially CT-NAND memory, according to the first embodiment, is to bias the bit lines of selected cells to a first voltage (e.g., ground voltage), and then to bias the bit lines of unselected cells to a second voltage (e.g., control voltage). Such bit line bias needs to be done before word line voltage application.

More specifically, the pre-charging is done in the following manner:

(i)-1. biasing all of bit lines at a pre-charge voltage, for example, a power supply voltage (e.g., Vpwr)

(i)-2. discharging a selected bit line (i.e. a bit line that is coupled to a target cell (the cell to be programmed)) to ground voltage, and also, keeping the power supply voltage on an unselected bit line (i.e. a bit line that is not coupled to the target cell)

(i)-3. After the unselected bit line has been biased to be the power supply voltage for a while, supplying a greater voltage than the power supply voltage to the unselected bit lines.

After the pre-charging, when a high voltage (selection word line voltage, for example 20 volt) is applied on the gate of the selected cell, the selected cell can be programmed with the grounded channel.

The drain selector transistor (SDG) connected to the selected bit line should become "on" when the channel is grounded and a selection line (i.e. gate of the drain selector transistor) is biased.

The drain selector transistor connected to the unselected bit line should be kept off when the channel is biased at the control voltage. Accordingly, the corresponding channel of the non-selected cell is kept floating. This floating channel rises with the high voltage on the word line when a high voltage is applied to the word line, thereby preventing the unselected cell from being programmed. Self boosting technique may be used to provide an inhibit voltage.

As a result of the bit line pre-charge, the selected bit lines are pre-charged to ground voltage and the non-selected bit lines are pre-charged to an inhibit voltage. Only the bit lines of the selected cells are connected to the page-buffer (s) that contain the data for programming, and the bit lines of the unselected cells are kept at the inhibit voltage.

In program, selectors 204, 205, 208, and 209 may be set as follows.

At the above-mentioned (i)-1, the pre-charge selector 204 and 205 (e.g., PSELE and PSELO) are conductive. The page buffer page-buffer selector 208 and 209 are non-conductive.

At the above-mentioned (i)-2 and -3, the selected side pre-charge selector, for example 204, is brought to be non-conductive, and the selected side page-buffer selector 208 is brought to be conductive. Therefore, the selected bit line can be discharged to a ground voltage potential. On the other hand, the unselected side pre-charge selector, for example 205, is kept (brought) to be conductive. The unselected side page-buffer selector 209 is kept (brought) to be non-conductive.

At the above-mentioned (ii), the high voltages are applied to the word lines. This causes the selected cells to be programmed and the unselected cells to not be programmed.

Figure 6:
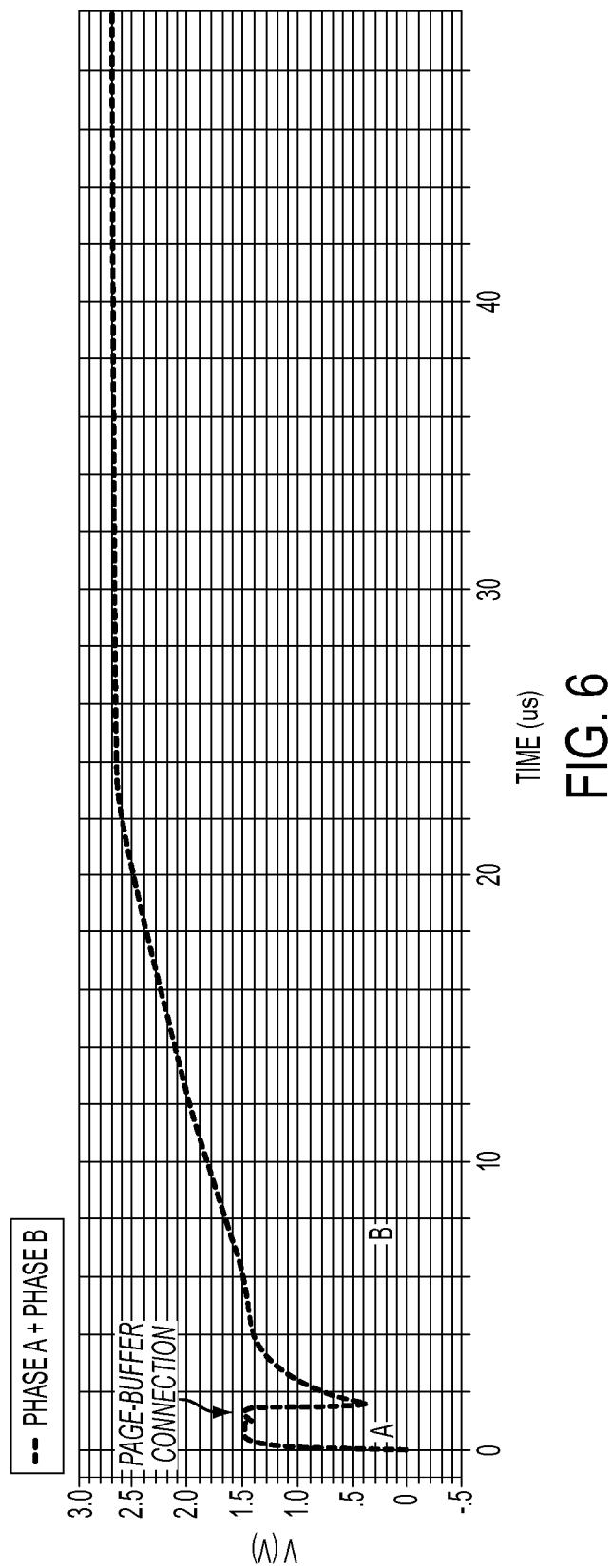
FIG. 6 shows an example of a voltage waveform on a bit line during phase A and phase B of a programming operation, according to a second embodiment of the present disclosure.

Turning to FIG. 6, phase B (as shown therein) is susceptible to charge couplings between the bit lines. As seen in FIG. 6, an unselected bit line that needs to be kept at a control voltage experiences a drop in the voltage level due to coupling with a neighboring bit line of a selected cell that is grounded. Thus, to prevent or compensate for this voltage drop, the bit lines of the unselected cells are provided with a recovery voltage from the charge pump (or any equivalent thereof) to keep its voltage level at the control voltage.

For the floating-gate type memory, the control voltage may be simply a power supply voltage, while for charge-trap (CT) memories, the control voltage may be selected to be a value higher than the power supply voltage. This consideration can be done due to wider threshold distribution of the drain selector transistors in CT-memories.

To achieve such control voltages higher than the power supply, CT-NAND memories employ a charge pump or a vdc regulator (e.g., voltage regulator) biased by a charge pump.

As one aspect, if, as will be explained below, the pre-charging and/or the recovery process is done by using both the power supply and a charge pump (or any equivalent thereof), this may provides a much more efficient mechanism, which is to pre-charge or recover the control voltage on the bit lines of the unselected cells in terms of both the processing time and power consumption, than by using only the charge pump.

Figure 3:
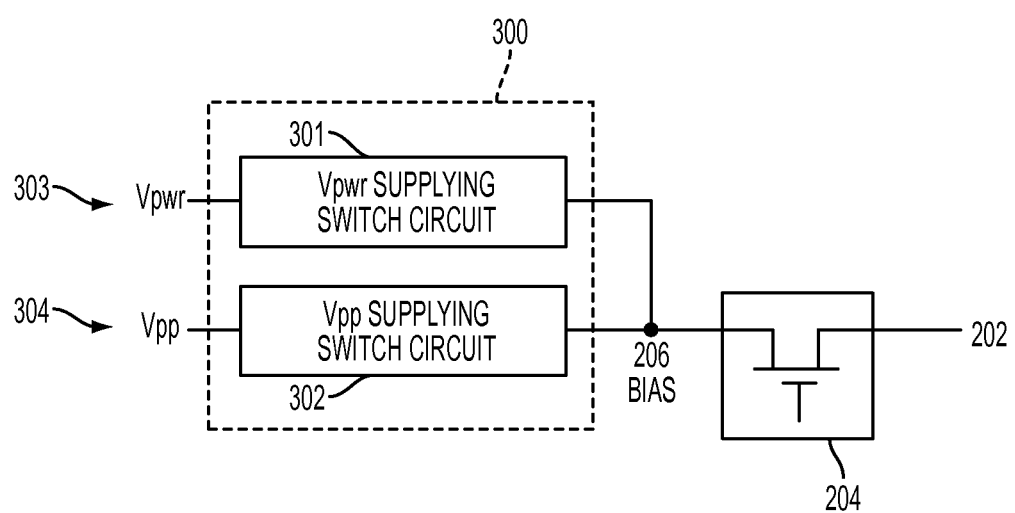
FIG. 3 shows an example of a biasing scheme for a pre-charge selector, according to the first embodiment of the present disclosure.

FIG. 3 shows an example of a biasing scheme for a pre-charge selector, according to the first embodiment of the present disclosure.

A selection circuit 300 is connected to BIAS node 206 shown in FIG. 2, which is then connected to a pre-charge selector transistor 204. The selector 204 is connected to bit line 202 and controls whether to ground the bit line 202 or pre-charge the bit line 202 to a control voltage through PSELE (in FIG. 2). Selection circuit 300 may include two switch circuits, a power supply (Vpwr) supplying switch circuit 301 and a regulated power supplying switch circuit 302.

The power supply supplying switch circuit 301 is connected to a power supply node 303 that is provided with the power supply voltage, Vpwr.

In one example, the node 303 may be configured as explained below in FIG. 4.

In another example, the node 303 may be connected directly to a power supply terminal (e.g. Vdd) of a chip.

The regulated power supplying switch circuit 302 is connected to a node 304 that is provided with a regulated voltage, Vpp, generated by a charge pump, a vdc regulator, or any equivalent thereof.

In one example, the node 304 may be configured as explained below in FIG. 4.

In another example, the node 304 may be directly connected to a high power supply terminal of a chip, provided that such high power supply (higher than Vdd) is supplied from external to the terminal of the chip.

Accordingly, BIAS node 206 may be charged with the voltage supplied by either or both of the power supply Vpwr and the regulated voltage Vpp through the respective switch circuits. For example, BIAS node 206 may be supplied with the power supply voltage Vpwr, and thereby charge the bit line 202 with Vpwr until it reaches a certain predetermined voltage, and thereafter, may be supplied with the regulated voltage Vpp, and consequently charge the bit line 202 with Vpp until the bit line 202 reaches the control voltage. The selection circuit 300 is configured to determine whether to make a first connection path between the bit line 202 and the power supply node 302, or to make a second connection path between the bit line 202 and the regulated power node 304.

Figure 4:
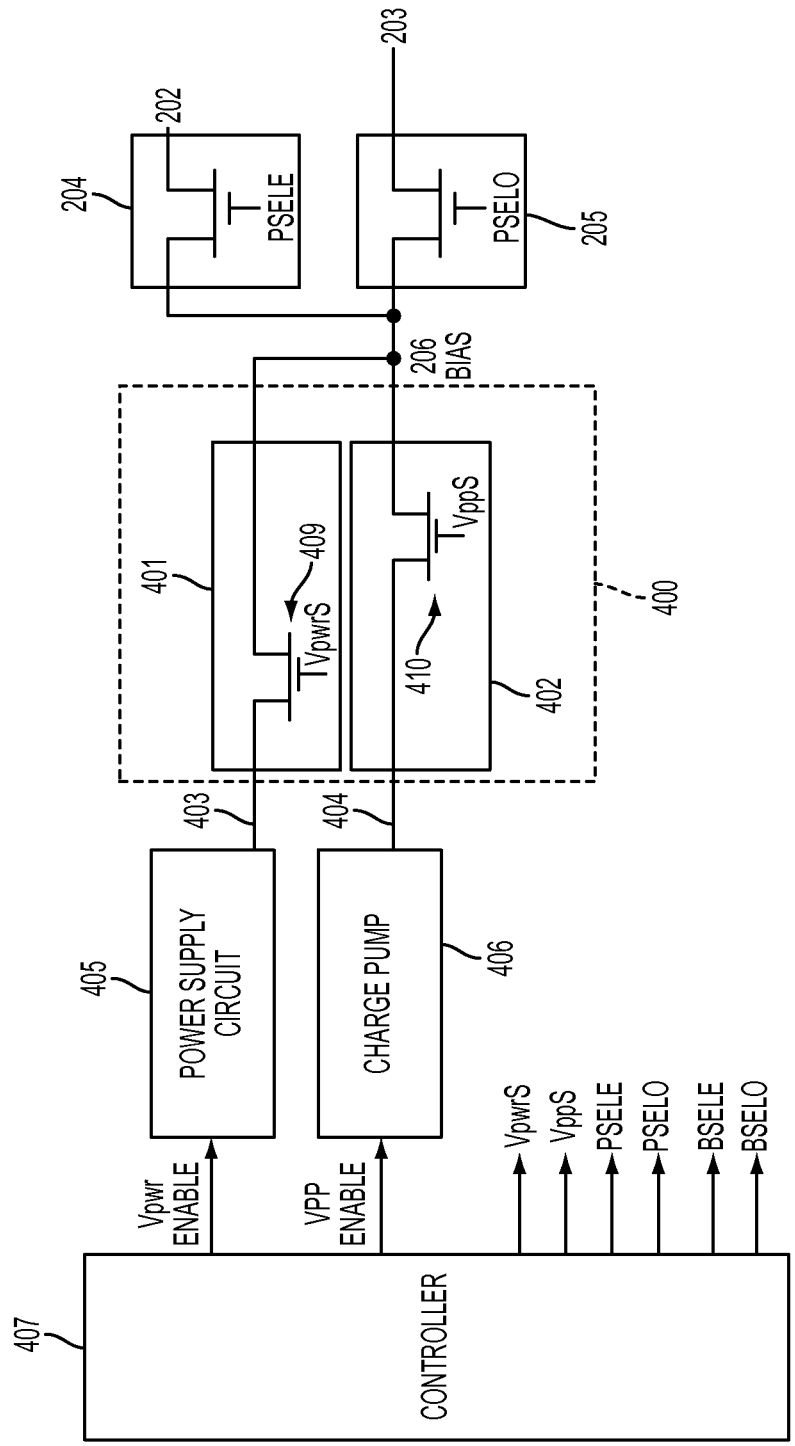
FIG. 4 shows another example of a biasing mechanism for a pair of pre-charge selectors, according to the first embodiment of the present disclosure.

FIG. 4 shows another example of a biasing mechanism for a pair of pre-charge selectors, according to the first embodiment of the present disclosure.

A selection circuit 400 may correspond to a controller 300 in FIG. 3.

A controller 407, power supply circuit, and charge pump may correspond to the controller 101, Vpwr supply, and charge pumps shown in FIG. 1.

A selection circuit 400 is connected to BIAS node 206. The BIAS node 206 is connected to a common node shared by the two pre-charge selectors 204 and 205, as shown in FIG. 2. The selector 204 is connected to bit line 202, and the gate of the pre-charge selector 204 is controlled by control signal PSELE. The selector 205 is connected to a different bit line 203, and the gate of the pre-charge selector 205 is controlled by control signal PSELO.

The selection circuit 400 includes two circuits—a power supply voltage (Vpwr) supplying switch circuit 401 and a regulated voltage (Vpp) supplying switch circuit 402. The switch in circuit 401 is a transistor 409 whose gate is controlled by control signal VpwrS, and the switch in circuit 402 is a transistor 410 whose gate is controlled by control signal VppS. The transistor 409 can make a path between Vpwr node 403 and BIAS node 206, and the transistor 410 can make a path between Vpp node 404 and BIAS node 206.

Vpwr node 403 is coupled to the power supply circuit 405, which supplies a power supply voltage (Vpwr) onto the Vpwr node 403 when it receives a Vpwr Enable signal from controller 407. Vpp node 404 is coupled to the charge pump 406, which supplies a regulated voltage (Vpp) onto the Vpp node 404 when it receives a VPP Enable signal from the controller 407. Vpwr and Vpp are higher than the ground voltage, and Vpp is usually higher than Vpwr. The controller 407 supplies control signals, including not only the Vpwr Enable and Vpp Enable signals for controlling the circuits 405 and 406, respectively, but also VpwrS (for switch 409), VppS (for switch 410), PSELE (for pre-charge selector 204), PSELO (for pre-charge selector 205), BSELE (for bit-line selector 208 in FIG. 2) and BSELO (for bit-line selector 209).

Although FIG. 4 only shows a single n-mos transistor switch configuration for each of the power supply (Vpwr) supplying switch circuit 401 and regulated voltage supplying switch circuit 402 with the corresponding control voltage applied to the gate electrode of the transistor, other switch configurations or circuits, including, but not limited to, a p-mos transistor switch, a c-mos transistor switch, or bipolar transistor switch, or any other switch configuration or circuit equivalent thereof as will be apparent to one of ordinary skill in the art. The same applies to all of the selector circuits as well.

Operation of circuits in FIG. 4 is as follows.

During a programming operation of the memory cells, each of bit lines is allocated to an unselected cell or a selected cell. If the bit lines 202 and/or 203 are connected to an unselected cell(s), the bit line(s) of the unselected cell(s) is/are charged to a control voltage by making an electrical connection path to the voltage supplying nodes 403 and/or 404. The bit line(s) of the selected cell(s) is/are charged to a ground voltage by making another electrical (not shown in FIG. 4) to the ground voltage potential.

For example, if the bit line 202 is coupled to an unselected cell, selection circuit 400 can establish a first electrical connection path from BIAS node 206, power supply voltage (Vpwr) supplying switch circuit 401 and power supply (Vpwr) node 403, where the BIAS node 206 is used to charge the bit line 202 through the selector 204. This first electrical connection path may last until the voltage level on the bit line 202 reaches a threshold voltage (V1). After the bit line 202 reaches V1, the selection circuit 400 can establish a second electrical connection path from BIAS node 206, regulated voltage (Vpp) supplying switch circuit 402 and regulated voltage (Vpp) node 404. This second connection path may last until the bit line 202 reaches the control voltage. It is to be noted that use of charge pumps 406 may require an undesirable amount of power and current consumption, and by utilizing both the power supply (Vpwr) and the regulated voltage (Vpp), the circuit may reduce the power and current consumption. Furthermore, depending on the technical requirements and design needs, phase A (as shown in FIG. 6) may not utilize both the power supply and regulated voltage (e.g., the first and second electrical connection paths). In other words, the bit lines 202 and/or 203 may be pre-charged using only one of the first and second electrical connections paths, but not both, if it is so desired.

In phase B of the programming operation, the recovery of the bit lines of the unselected cells may be done in a similar manner. For example, if the bit line 202 experiences a voltage drop due to couplings with other bit lines of selected cells, which are grounded, the voltage of the bit line 202 may be recovered to reach the control voltage again by using first the power supply circuit until it recovers to a threshold level (V1') and then using the charge pump circuit until it recovers to the full control voltage.

More specifically, the power supply circuit is used first when the switch 409 in the power supply switch circuit 401 is turned on to establish a first electrical connection path from BIAS node 206, and power supply (Vpwr) node 403, where the BIAS node 206 is then coupled to bit line 202 through the selector 204. After the bit line 202 reaches the threshold level (V1'), the switch 409 is turned off and switch 410 is turned on instead. The "ON" (i.e., triggered) state of switch 410 establishes a second electrical connection path from BIAS node 206 and regulated voltage (Vpp) node 404, and this path is used until the bit line 202 reaches the control voltage. Furthermore, depending on the technical requirements and design needs, including, but not limited to, cases having only a small amount of data to program, the recovery process in the phase B may not utilize both the power supply and regulated voltage circuits (e.g., the first and second electrical connection paths), but only either one of the circuits (e.g., only the charge pump circuit 406).

The "ON" and "OFF" state of the switches 409 and 410 may be controlled by VpwrS and VppS, and these control signals may be generated in concert with Vpwr Enable and VPP Enable signals from the controller 407. This control may be realized by using a write state machine and/or a specific algorithm or specific control circuitry in the semiconductor device.

Figure 5B:
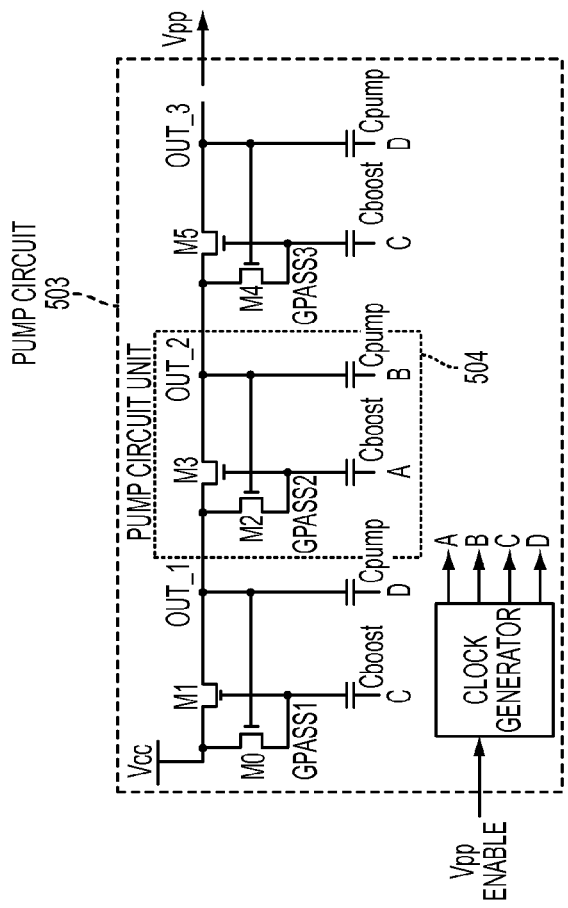
FIG. 5B shows an example of a charge pump circuit, which may be used in the circuit shown in FIG. 4 according to an embodiment of the present disclosure.
Figure 5C:
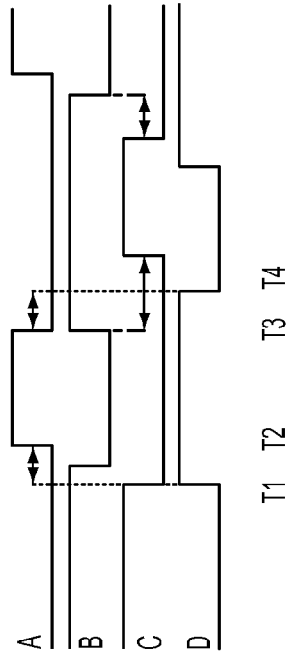
FIG. 5C is an example of a clock signal waveform for the charge pump of FIG. 5B.
Figure 5A:
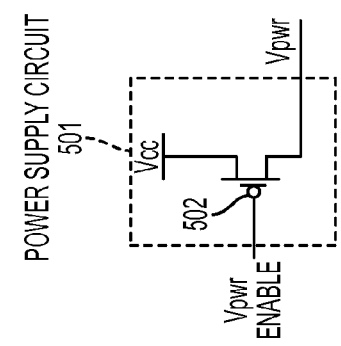
FIG. 5A shows an example of a power supply circuit, which may be used in the circuit shown in FIG. 4 according to an embodiment of the present disclosure.

FIG. 5A shows an example of a power supply circuit used in the circuit shown in FIG. 4 according to an embodiment of the present disclosure.

An example of the power supply circuit 405 in FIG. 4 is a circuit 501 shown in FIG. 5. The power supply circuit 501 includes a p-mos transistor 502 whose gate is configured to receive a Vpwr Enable control signal from a controller (e.g., controller 407 shown in FIG. 4). The source of the transistor 502 may be coupled to Vcc, and the drain outputs Vpwr when the p-mos transistor 515 is turned on via a Vpwr Enable signal. This Vpwr node may correspond to the node 403 in FIG. 4.

In one example, a n-mos transistor, a c-mos transistor, or any other circuit configuration may be used instead of the p-mos transistor 502.

In another example, the p-mos transistor 502 may be omitted so as to connect the Vpwr node directly to Vcc node.

FIG. 5B shows an example of a charge pump circuit used in the circuit shown in FIG. 4 according to an embodiment of the present disclosure. A circuit 503 receives Vcc, which is to be boosted by the charge pump circuit units 504, and outputs Vpp that may be higher than Vpwr as exemplarily shown in FIG. 5A.

The charge pump circuit 503 is a four-phase charge pump receiving four different clock signals A, B, C, and D. The charge pump 503 includes three charge pump units 504 connected in series between Vcc and output voltage Vpp. One charge pump unit 504 includes a pump capacitor (Cpump), a boosting capacitor (Cboost), and two pass transistors (M2 and M3). The four clock signals (A, B, C, D) may be activated in response to Vpp Enable signals from the controller (e.g., controller 407 shown in FIG. 4).

FIG. 5C is an example of a clock signal waveform for the charge pump of FIG. 5B, and will be explained in association with the circuit in FIG. 5B.

At T1, when clock signal C goes low, clock signal D goes high and the input voltage at node OUT_1 can be boosted across transistor M1 under control of GPASS1 which reaches near the value of the input voltage Vcc through the transistor M0.

At T2, when signal B goes low and A goes high, the transistor M3 is turned on because node GPASS2 is boosted. As a consequence, the output node OUT_2 is charged to the input voltage of node OUT_1.

At T3, when signal A goes low and signal B goes high, the output node OUT_2 is boosted to reach the value of input node OUT_1 plus the power supply voltage. Simultaneously, the node GPASS2 reaches near the value of the input voltage at OUT_1 through the transistor M2.

At T4, when signal D goes low and signal C goes high, the charge is transferred from the node OUT_2 to the node OUT_3 using pass transistor M5 under control of GPASS3 which reaches near the value of the input voltage at OUT_2 through the transistor M4.

The same operation is done in each of the charge pump circuit units 504, and since in each operation, the output voltage is higher than the input voltage, the last output voltage (Vpp) at node OUT_3 becomes higher than the first input voltage (Vcc). This Vpp node may correspond to the node 404 in FIG. 4. Although the exemplary charge pump circuit 503 in FIG. 5B has three charge pump units 504 for pumping up the voltage, it may employ any other number of the pumping units depending on the voltage requirements of the semiconductor device.

Further, power supply circuit 501 and charge pump circuit 503 that are shown in FIGS. 5A and 5B are provided only as examples, and are not intended to limit the scope of any claims in any way. In fact, one of ordinary skill in the art would readily recognize that any obvious variants of a power supply circuit, a charge pump circuit, or any regulated voltage generating circuit equivalent thereof, may be used in conjunction with the circuit shown in FIG. 4 without changing the spirit of any claims or any inventive concepts disclosed in the present disclosure.

FIG. 6 shows an example of a voltage waveform on a bit line during phase A and phase B of a programming operation, according to the second embodiment of the present disclosure.

Y axis is a voltage (volt) and X axis is a time (μs). A broken line shows a voltage transition of a bit line (page-buffer connection).

A program operation includes phase A and B.

Phase A is a phase that a pre-charge operation is performed.

Phase B include a phase that a bit line is recovered from a voltage drop (about 0.3 volt) to a first recovery voltage (about 1.5 volt), and a bit line is biased to be from the first recovery voltage (about 1.5 volt) to a second recovery voltage (about 2.7 volt). The second recovery voltage finally becomes a inhibit voltage needed in the program operation.

During phase A, the bit line is pre-charged to a control voltage of around 1.5V. Here, the pre-charging of the bit line to 1.5V is done using the power supply circuit.

In another example, both of the power supply circuit and the charge pump circuit may be used. If both the power supply circuit and charge pump circuit are used, the bit line may be charged using the power supply circuit first until it is pre-charged to a target value (V1) and then charged using the charge pump circuit to reach the full control voltage of 1.5V. A target voltage is a value between ground and the full control voltage, and, accordingly, in this case, V1 is a value between 0 and 1.5V.

At about 1.8 μs (i.e., 1.8 micro-seconds), phase A will be complete and phase B will start with the bit lines being connected to the page buffers that store the programming data. The neighboring bit lines of the selected cells are grounded due to this page-buffer connection, and couplings with these grounded bit lines cause the bit line of the unselected cell to experience a voltage drop, as shown in FIG. 6.

It is worth noting that the unselected bit line, in this case, has a drop of more than 1V, such that the voltage after the drop becomes lower than 0.5V.

In this view, this embodiment provides to compensate for the voltage drop as can be seen in FIG. 6.

At phase B, the voltage on the bit line is recovered using both the power supply and the charge pump—that is, the power supply (Vpwr) is used to charge the bit line until it recovers to a first target voltage level (V1', for example 1.5 v), and then, subsequently, the charge pump circuit is used until it recovers to a full control voltage (a second target voltage) of 2.7V. The control voltage (second target voltage) is higher than the power supply voltage (i.e. Vpwr). The first target voltage is a value that a voltage before the voltage drop has, and accordingly, in this case, V1' is a value about 1.5V. At about 6 μs into the charge pump application (and only after about 4.2 μs from the start of the recovery process), the bit line will recover from the first target voltage (1.5v) to the full target voltage of 2.7V. In this way, the inhibit voltage on unselected bit line may be obtained. In addition to this unselected bit line voltage bias, self-boosting (channel coupling) due to word line voltage application may be used to obtain inhibit voltage on unselected bit line.

As a result, an appropriate inhibit voltage can be obtained. Accordingly, it is performed to program cells on page.

In another example, at phase B, only charge pump, not power supply, may be used. The charge pump changes a voltage from the dropped value (about 0.5v) so as to become 1.5 volt, and then finally reach the full control voltage about 2.7 v.

In still another example, both the power supply and the charge pump can be used at the same time to bias the unselected bit line.

Figure 7:
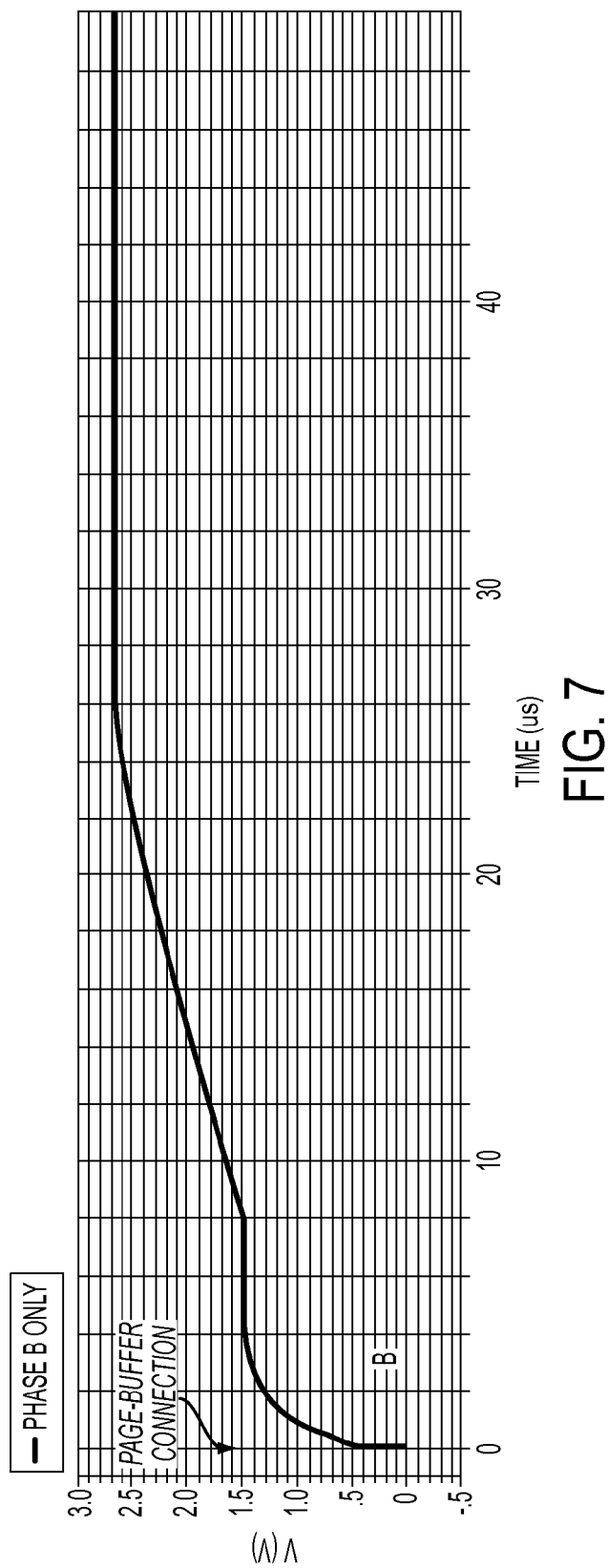
FIG. 7 shows an example of a voltage waveform on a bit line during phase B of a programming operation, according to a third embodiment of the present disclosure.

FIG. 7 shows an example of a voltage waveform on a bit line during phase B of a programming operation, according to a third embodiment of the present disclosure.

In FIG. 7, phase A shown in FIG. 6 is omitted, and, the page-buffer connection occurs at time 0. So to speak, in FIG. 7, differently from operation of FIG. 6, it can be omitted to charge all bit lines in order to obtain inhibit voltage on unselected bit line. Thus, time reduction and power consumption reduction can be obtained.

For this, the unselected bit line (as shown in FIG. 7) starts being charged from the ground voltage, and the selected bit line stays the ground voltage. For example, the selected bit line voltage is obtained by rendering corresponding pre-charge selector conductive and corresponding page-buffer selector non-conductive, and the unselected bit line voltage is obtained by rendering corresponding pre-charge selector non-conductive and corresponding page-buffer selector conductive.

Operation in the phase B shown in FIG. 7 is the substantially same as that in the phase B of FIG. 6, and, therefore, the detail description is omitted herein. In FIG. 7, a target voltage (V1') may be a value around 1.5v which may be controlled between the ground voltage and the control voltage (1.5V). For example, until about 8 μs, power supply circuit is connected to the bias 206 to provide an unselected bit line voltage. At about 8 us, charge pump circuit, instead of (or in addition to) power supply circuit, is connected to bias 206 to provide the unselected bit line voltage. The unselected bit line is fully charged to the control voltage of 2.7V. As the result, inhibit voltage on unselected bit line can be obtained.

In another example, only charge pump, not power supply circuit, may be used.

In still another example, both power supply circuit and charge pump may be used simultaneously.

In all of the foregoing examples and embodiments, it is noted that the application of the target voltages (V1, or V1') in the pre-charging and/or the recovery processes of the bit lines of the unselected lines may be controlled by a write state machine such as a controller 1 with a specific algorithm stored in ROM shown in FIG. 1.

In one example, the semiconductor device may be configured to use the target for both the power supply and charge pump during the recovery process of phase B of the programming operation, only when the number of cells to be programmed is greater than a certain predetermined value (e.g., when there is a huge load of data to be programmed onto the memory array). As the number of cells to be programmed increases, it is more likely that the voltage drops on the bit lines of the unselected cells will be greater, and, accordingly, the use of the two circuits in the recovery process may help shorten the recovery time and power/current consumption incurred by the recovery.

In another example, depending on the technical requirements and design needs of the semiconductor device, the device may be configured to employ the target values irrespective of the size of the programming data stored in the page buffer. Instead, the device may be fixed to split the charging processes of the power supply and charge pump in a point of view of an amount of time.

In still another example, the device may be fixed to split the charging processes of the power supply and charge pump with reference to a voltage value of the target voltage.

Figure 8:
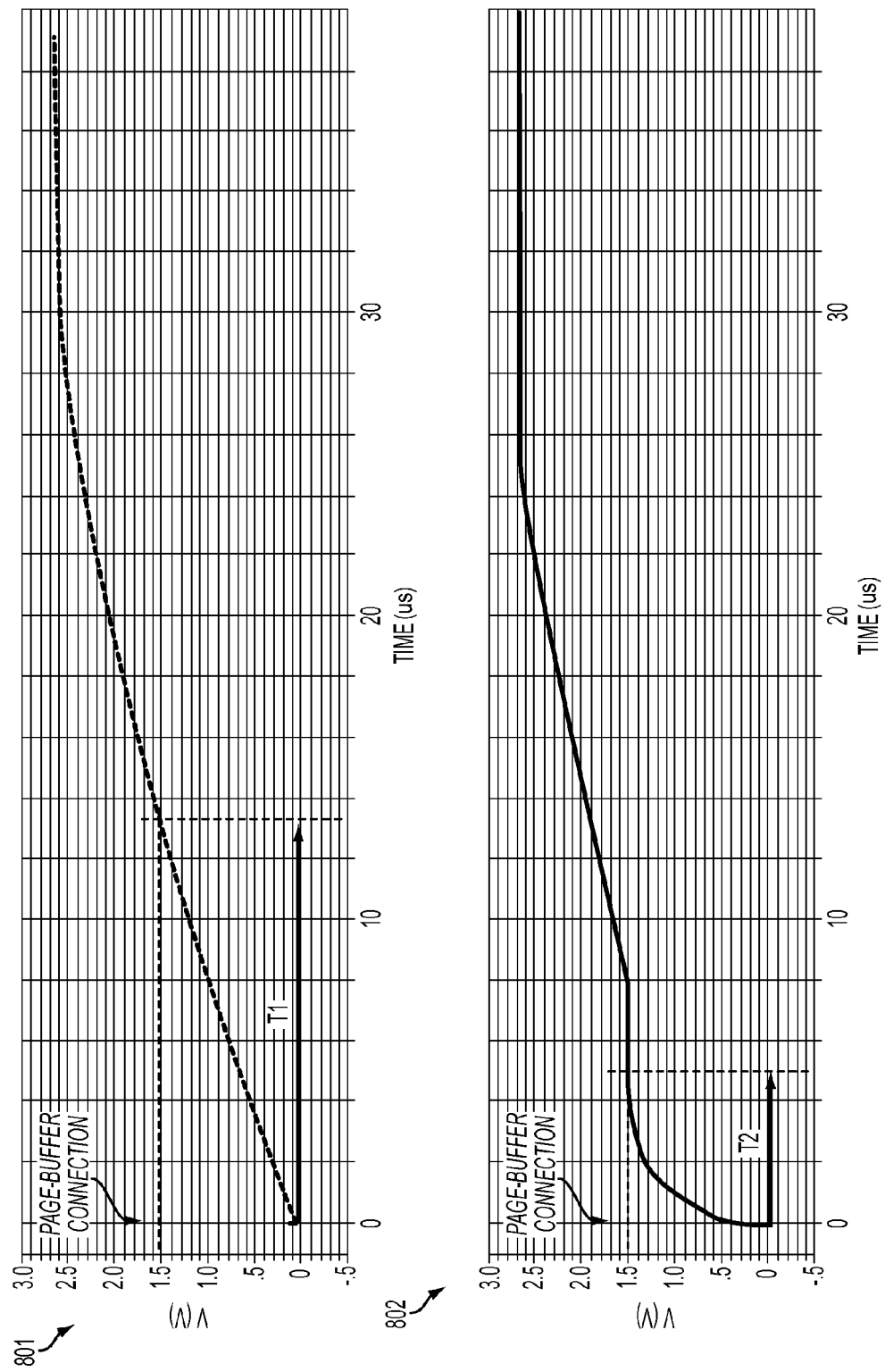
FIG. 8 shows an example of a voltage waveform on a bit line of an unselected cell in a memory array during a programming operation, the bit line being recovered by only a regulated voltage, compared with the example of FIG. 7.

FIG. 8 shows an example of a voltage waveform on a bit line of an unselected cell in a memory array during a programming operation, the bit line being recovered only with a regulated voltage, compared with the example of FIG. 7.

Graph 801 shows an example of a voltage waveform on a bit line of an unselected cell in a memory array during a programming operation, where the bit line is being recovered only with a regulated voltage (e.g., Vpp from the charge pump or a vdc regulator, or any regulated voltage generator circuit equivalent thereof). In this example, the voltage for the bit lines of the unselected cells is 1.5V, and it takes about 13.3~0.5 μs (T1) to recover the bit line from the ground voltage to reach 1.5 V. Finally, at about 30 μs, a voltage reaches about 2.7v.

Graph 802 shows an example of a voltage waveform on the same bit line of an unselected cell in a memory array during a programming operation, where the bit line is being recovered using both the power supply (Vpwr) and the regulated voltage to be compared to the graph 801. In the example shown in graph 802, the bit line is charged using the power supply (Vpwr) until it recovers to a target value, the target value being a voltage value between the ground voltage and the control voltage (e.g., 1.5V in this case), and, thereafter, the bit line continues to be charged using the regulated voltage. In this way, it takes only about 1ps (T2) to charge the bit line from the ground voltage to the control voltage (about 1.5V) and then finally takes 25 μs to reach about 2.7V. This accomplishes to save not only the time but also the power and current consumption associated with the recovery process.

It is noted that at graph 801, the charge pump circuit is activated in a whole time period of the operation. As one aspect, power consumption may be obtained at graph 802 because it can have a time period that the charge pump circuit is not activated. More specifically, in a first time period the power supply voltage is applied to an unselected bit line and in a second time period after the first time period the charge pumped voltage, instead of the power supply, is applied to the unselected bit line. As mentioned above, that is one of the examples at graph 802. In the first time period, the charge pump circuit is not necessary to be activated.

From the foregoing it will be appreciated that, although specific embodiments of the clock generator or oscillator according to the present disclosure have been described herein for purposes of illustration, various modifications may be made without deviating from the spirit and core principles of the disclosure.

What is claimed is:
1. A device comprising:
a non-volatile memory array in which a program operation including a plurality of phases is performed, the non-volatile memory array including,
first and second selection transistors,
a plurality of memory cells coupled between the first and second selection transistors,
a first bit line coupled to the first selection transistor, and
a first source line coupled to the second selection transistor;
first and second circuit nodes;
a first selection circuit selecting whether to make a first connection path between the first bit line and the first circuit node, and selecting whether to make a second connection path between the first bit line and the second circuit node;
a power supplying circuit coupled to the first circuit node and supplying a power supply voltage to the first circuit node, the power supply voltage being, when the first connection path is selected to be made by the first selection circuit, supplied to the first bit line; and
a first voltage supplying circuit coupled to the second node and supplying a first voltage to the second circuit node, the first voltage being, when the second connection path is selected to be made by the first selection circuit, supplied to the first bit line, the first voltage and the power supply voltage being higher than a ground potential, and the first voltage being higher than the power supply voltage,
wherein the first selection circuit selects the second connection path to supply the first voltage to the first bit line when or after the first selection circuit selects the first connection path to supply the power supply voltage to the first bit line, further wherein the supplying the power supply voltage to the first bit line and the supplying the first voltage to the first bit line are performed during a single phase of the program operation.

2. The device of claim 1, wherein the first selection circuit comprises:
a bias node;
a first pre-charge selector circuit coupled between the first bit line and the bias node and making, when activated, a connection path between the first bit line and the bias node;

a first switch circuit coupled between the bias node and the first circuit node coupled to the power supplying circuit, and the first switch circuit making, when activated, a connection path between the bias node and the power supplying circuit; and a second switch circuit coupled between the bias node and the second circuit node coupled to the first voltage supplying circuit, and the second switch making, when activated, a connection path between the bias node and the first voltage supplying circuit.

3. The device of claim 2, wherein the non-volatile memory array further comprises:

third and fourth selection transistors, a plurality of memory cells coupled between the third and fourth selection transistors, a second bit line coupled to the third selection transistor, and a second source line coupled to the fourth selection transistor;

and wherein the device further comprises:

a second pre-charge selector circuit coupled between the second bit line and the bias node and making, when activated, a connection path between the second bit line and the bias node.

4. The device of claim 1, further comprising:

a third circuit node;

a page-buffer circuit coupled to the third circuit node to store data to be programmed and to be read out from one of the memory cells; and a page-buffer selector circuit coupled between the first bit line and the third circuit node, the page-buffer selector circuit making, when activated, a connection path between the page-buffer circuit and the first bit line.

5. The device of claim 1, wherein each of the memory cells is a charge trap type of a flash memory cell.

6. The device of claim 1, the device further comprising:

a page buffer that stores data to be programmed or read out from one of the memory cells, wherein the first selection circuit selects whether to make the first connection path, or the second connection path, based at least on the data stored in the page buffer.

7. The device of claim 1, wherein:

the first selection circuit selects to make the first connection path between the first bit line and the first circuit node, if the first bit line is at a voltage level below a first target voltage, and the first selection circuit selects to make the second connection path between the first bit line and the second circuit node, if the first bit line is at a voltage level equal to or greater than the first target voltage.

8. The device of claim 3, wherein:

the first selection circuit selects whether to make a third connection path between the second bit line and the first circuit node via the bias node, and the first selection circuit selects whether to make a fourth connection path between the second bit line and the second circuit node via the bias node.

9. The device of claim 2, wherein:

the first switch circuit includes a first transistor switch controlled by a first control signal, the second switch circuit includes a second transistor switch controlled by a second control signal, the first pre-charge selector circuit includes a third transistor controlled by a third control signal, and the first, second, and third control signals are generated by a controller of the device.

10. The device of claim 1, wherein the first voltage supplying circuit includes at least one charge-pump circuit.

11. A method comprising:

performing a program operation, the program operation including a plurality of phases, on a non-volatile memory array comprising:

first and second selection lines, a plurality of word lines, a plurality of bit lines, a plurality of NAND memory strings each including:

a first selection transistor coupled to an associated one of the bit lines and including a gate coupled to the first selection line, a second selection transistor including a gate coupled to the second selection line, and a plurality of memory cells coupled between the first and second selection transistors and each including a gate coupled to an associated one of the word lines;

the performing of the program operation comprising:

selecting one or more of the bit lines as a selection bit line;

selecting a remaining of the bit lines as a non-selection bit line;

generating from a power supply voltage a first voltage that is higher than the power supply voltage, the first voltage and the power supply voltage being higher than a ground voltage potential;

supplying the ground voltage potential to the selection bit line so that memory cells associated with the selection bit line are allowed to be shifted to a program condition;

supplying the power supply voltage to the non-selection bit line until the non-selection bit line reaches a target voltage, the target voltage being less than the first voltage and being equal to or less than the power supply voltage; and supplying the first voltage to the non-selection bit line so that memory cells associated with the non-selection bit line are prevented from being shifted to a program condition, wherein the supplying of the first voltage to the non-selection bit line is performed after the non-selection bit line reaches the target value, further wherein the supplying the power supply voltage to the non-selection bit line and the supplying the first voltage to the non-selection bit line are performed during a single phase of the program operation.

12. The method of claim 11, where the performing of the program operation further comprising:

supplying the power supply voltage to the plurality of bit lines, and wherein the supplying of the power supply voltage is performed before supplying the ground voltage potential to the selection bit line and before supplying the first voltage to the non-selection bit line.

13. The method of claim 12, where the performing of the program operation further comprising:

stopping supplying the power supply voltage to the plurality of bit lines, and wherein the stopping of the supplying of the power supply voltage is performed before supplying the ground voltage potential to the selection bit line and before supplying the first voltage to the non-selection bit line.

14. The method of claim 11, where the performing of the program operation further comprising:

supplying the power supply voltage to the plurality of bit lines, stopping supplying the power supply voltage to the selection bit line among the plurality of bit lines, keeping supplying the power supply voltage to the non-selection bit line among the plurality of bit lines, and wherein the supplying of the power supply voltage, the stopping of the supplying of the power supply voltage to the selection bit line, and the keeping of the supplying of the power supply voltage to the non-selection bit line are performed before supplying the ground voltage potential to the selection bit line and before supplying the first voltage to the non-selection bit line.

15. The method of claim 11, wherein the performing the program operation further comprising:

selecting one of the word lines as a selection word line;

selecting a remaining of the word lines as a non-selection word line; and supplying a selection word line voltage to the selection word line and supplying a non-selection word line voltage to the non-selection word line so that one or more of the memory cells associated with the selection bit line and the selection word line is shifted to a program condition, and a remaining of the memory cells associated with the non-selection bit line and the selection word line, with the selection bit line and the non-selection word line, and with the non-selection bit line and the non-selection word line is not shifted to the program condition.

16. The method of claim 11, wherein each of the memory cells of the non-volatile memory array is a charge trap type of a flash memory cell.

17. The method of claim 11, further comprising, supplying the power supply voltage to the non-selection bit line for a predetermined amount of time; and wherein the supplying of the first voltage to the non-selection bit line is performed after the predetermined amount of time has passed.

18. The method of claim 11, further comprising, detecting if the number of selection bit lines is equal to or greater than a predetermined value, and when it is detected that the number of selection bit lines is equal to or greater than a predetermined value, supplying the power supply voltage to the non-selection bit line for a predetermined amount of time, wherein the supplying of the first voltage to the non-selection bit line is performed after the predetermined amount of time has passed, and wherein when it is detected that the number of selection bit lines is less than the predetermined value, the supplying of the first voltage to the non-selection bit line is performed.

* * * * *